(12) United States Patent
Koide

(10) Patent No.: US 11,454,896 B2
(45) Date of Patent: Sep. 27, 2022

(54) IMPRINT APPARATUS, IMPRINTING METHOD, AND MANUFACTURING METHOD OF ARTICLE

(71) Applicant: CANON KABUSHIKI KAISHA, Tokyo (JP)

(72) Inventor: Hiroyuki Koide, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/830,021

(22) Filed: Mar. 25, 2020

(65) Prior Publication Data

US 2020/0310260 A1 Oct. 1, 2020

(30) Foreign Application Priority Data

Mar. 29, 2019 (JP) .............................. JP2019-068856

(51) Int. Cl.
*G03F 9/00* (2006.01)
*G03F 7/00* (2006.01)
(Continued)

(52) U.S. Cl.
CPC .......... *G03F 9/7088* (2013.01); *B29C 33/424* (2013.01); *B29C 43/58* (2013.01); *G03F 7/0002* (2013.01); *G03F 9/7076* (2013.01); *G03F 9/7084* (2013.01); *H01L 21/027* (2013.01); *B29C 2043/5891* (2013.01)

(58) Field of Classification Search
CPC .......... B29C 2043/5891; B29C 33/424; B29C 43/58; G03F 7/0002; G03F 9/7076; G03F 9/7084; G03F 9/7088; H01L 21/027
See application file for complete search history.

(56) References Cited

U.S. PATENT DOCUMENTS

2013/0078820 A1* 3/2013 Mikami ................ G03F 7/0002
264/447
2013/0078821 A1* 3/2013 Furutono .............. G03F 7/0002
264/447
(Continued)

FOREIGN PATENT DOCUMENTS

JP 2013-69918 A 4/2013
JP 2013-168504 A 8/2013
(Continued)

*Primary Examiner* — Deoram Persaud
(74) *Attorney, Agent, or Firm* — Canon U.S.A., Inc. IP Division

(57) ABSTRACT

An imprint apparatus using a mold having a pattern region includes an irradiation unit that irradiates a substrate with irradiation light. The irradiation light has an intensity distribution over a region along a periphery of a shot area of the substrate and being capable of increasing viscosity of an imprint material or of solidifying the imprint material. The imprint apparatus also includes a control unit that sets an imprint condition for forming a pattern of the imprint material so as to reduce at least one of an extrusion of the imprint material from the shot area and an unfilling of the imprint material occurring in the shot area on the basis of results of detecting at least one of the extrusion and the unfilling of the imprint material obtained by detecting the pattern of the imprint material formed on the substrate.

16 Claims, 11 Drawing Sheets

(51) Int. Cl.
*B29C 43/58* (2006.01)
*B29C 33/42* (2006.01)
*H01L 21/027* (2006.01)

(56) References Cited

U.S. PATENT DOCUMENTS

| | | | | |
|---|---|---|---|---|
| 2016/0320716 A1* | 11/2016 | Hosaka | ............ | G03F 7/0002 |
| 2017/0023857 A1* | 1/2017 | Sato | ............ | G03F 9/7042 |
| 2018/0154559 A1* | 6/2018 | Harayama | ............ | G03F 7/0002 |
| 2018/0329315 A1* | 11/2018 | Hirano | ............ | G03F 7/0002 |
| 2020/0223126 A1* | 7/2020 | Hayashi | ............ | H01L 21/027 |
| 2020/0333704 A1* | 10/2020 | Koide | ............ | G03F 7/0002 |
| 2020/0341368 A1* | 10/2020 | Yamashita | ............ | B29C 33/424 |
| 2020/0387067 A1* | 12/2020 | Sato | ............ | B29C 59/02 |
| 2021/0245404 A1* | 8/2021 | Fujimoto | ............ | B29C 59/002 |

FOREIGN PATENT DOCUMENTS

| | | | |
|---|---|---|---|
| JP | 2017-162923 A | 9/2017 | |
| JP | 2018-125377 A | 8/2018 | |

* cited by examiner

FIG. 10A
FIG. 10B
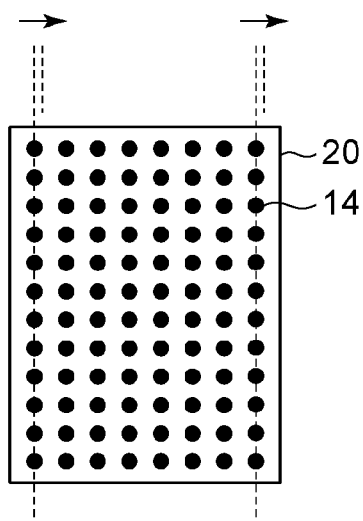
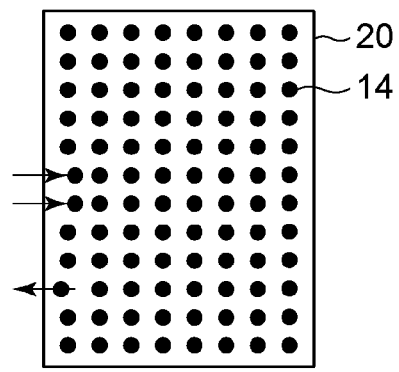
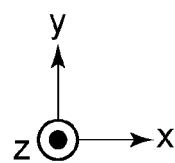
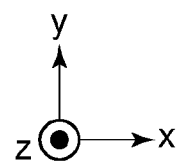

IMPRINT APPARATUS, IMPRINTING METHOD, AND MANUFACTURING METHOD OF ARTICLE

BACKGROUND

Field of the Disclosure

The present disclosure relates to an imprint apparatus that forms a pattern of an imprint material on a substrate by using a mold, and also relates to an imprinting method and to a manufacturing method of an article.

Description of the Related Art

An imprinting method for molding an imprint material on a substrate using a mold is known as a method for manufacturing an article, such as a semiconductor device and a micro-electromechanical system (MEMS). In the imprinting method, the imprint material is supplied onto the substrate, and the mold and the imprint material are brought into contact with each other (mold pressing). The imprint material is cured with the mold and the imprint material being in contact, and subsequently the mold is released from the cured imprint material (mold releasing). Thus, the pattern of the imprint material is formed on the substrate.

An imprint apparatus, which implements the imprint method, brings the mold and the imprint material supplied onto a shot area on the substrate into contact with each other. The imprint apparatus subsequently exerts a pressing force on the mold and the imprint material, which causes the imprint material to spread toward the outside of the shot area. Here, the imprint material may be extruded outward from the shot area, from the edge of the substrate, and from a pattern region of the mold.

Japanese Patent Laid-Open No. 2013-69918 discloses that when the mold and the imprint material supplied on the shot area of the substrate are brought into contact with each other, UV light is emitted onto a region outside a pattern forming region and thereby cures the imprint material that is extruding outward from the pattern forming region. The imprint apparatus according to Japanese Patent Laid-Open No. 2013-69918 thereby prevents the imprint material from extruding out of the pattern forming region.

In order to cure the imprint material extruding out of the shot area, the imprint apparatus needs to irradiate the periphery of the pattern region of the mold with curing light at an appropriate timing. This is because the imprint material may become harder than necessary if light is emitted earlier or the imprint material may extrude out of the pattern region of the mold if light is emitted later. The irradiation timing of light can be set in advance so as to avoid this.

However, the way of the imprint material spreading (the degree of extrusion of the imprint material) when the imprint material is filled between the mold and the substrate varies depending on various factors, such as surface conditions of the mold and the substrate, an amount of supply of the imprint material, viscosity characteristics of the imprint material. As a result, even though the timing and intensity of light to be emitted is set in advance, the imprint material may still extrude out of the pattern region or an unfilled spot of the imprint material may still occur in the pattern region.

SUMMARY OF THE DISCLOSURE

The present disclosure provides an imprint apparatus for forming a pattern of an imprint material on a shot area of a substrate by using a mold having a pattern region. The imprint apparatus includes an irradiation unit that irradiates the substrate with irradiation light. The irradiation light has an intensity distribution over a region along a periphery of a shot area of the substrate and is capable of increasing viscosity of the imprint material or of solidifying the imprint material. The imprint apparatus also includes a control unit that sets an imprint condition for forming the pattern of the imprint material so as to reduce at least one of an extrusion of the imprint material from the shot area and an unfilling of the imprint material occurring in the shot area on the basis of results of detecting at least one of the extrusion and the unfilling of the imprint material obtained by detecting the pattern of the imprint material formed on the substrate.

Further features of the present invention will become apparent from the following description of exemplary embodiments with reference to the attached drawings.

BRIEF DESCRIPTION OF THE DRAWINGS

FIGS. 10A and 10B are views illustrating a state of a supplied imprint material according to a third embodiment.

DESCRIPTION OF THE EMBODIMENTS

Figure 1:
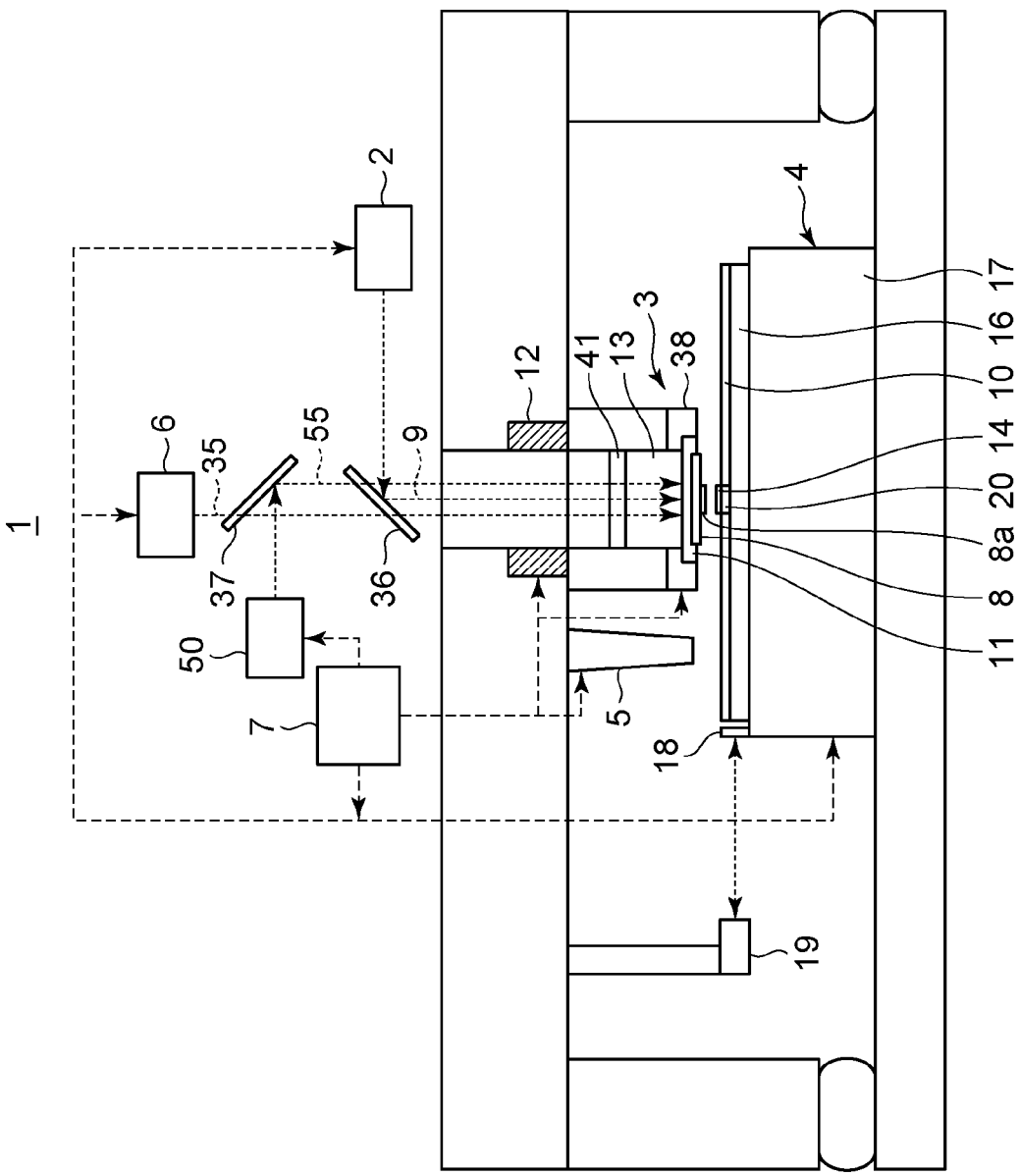
FIG. 1 is a view illustrating an imprint apparatus according to a first embodiment.

Embodiments will be described in detail with reference to the accompanying drawings. Note that in each drawing, like elements are denoted by like reference numerals, and duplicated description will be omitted.

First Embodiment

Imprint Apparatus

FIG. 1 is a schematic view illustrating a configuration of an imprint apparatus 1 according to the present embodiment. The configuration of the imprint apparatus 1 will be described first with reference to FIG. 1. Here, a surface on which a substrate 10 is disposed is assumed as XY plane, and a direction orthogonally intersects the XY plane is the Z direction (i.e., the height direction of the imprint apparatus 1). The X-, Y-, and Z-axes are defined accordingly as illustrated in FIG. 1. The imprint apparatus 1 is an apparatus for forming on a substrate 10 a patterned solidified object that has a pattern of projections and depressions transferred thereon. The patterned solidified object is formed by bringing a mold 8 into contact with an imprint material 14 supplied onto the substrate 10 and subsequently providing the imprint material 14 with curing energy. The mold 8 may be otherwise called a template or an original. The imprint apparatus 1 of FIG. 1 is used for manufacturing a device, such as a semiconductor device, which is otherwise referred to as an "article". The imprint apparatus 1 described here is an apparatus that employs a light curing method.

The imprint apparatus 1 includes a mold holding unit 3 (imprint head) that holds and moves the mold 8, a substrate holding unit 4 (substrate stage) that holds and moves the substrate 10, and a supply unit 5 (dispenser) that supplies the imprint material 14 onto the substrate 10. The imprint apparatus 1 further includes an irradiation unit 2, an image pickup unit 6 (detection unit), and a control unit 7. The irradiation unit 2 emits curing light 9 for curing the imprint material 14. The image pickup unit 6 emits light 35 and picks up an image of state of contact between the mold 8 and the imprint material 14. The control unit 7 controls the imprint apparatus 1. The imprint apparatus 1 also includes a mark detector 12 (detection unit) that detects marks formed on the mold 8 and on the substrate 10.

The mold holding unit 3 includes a mold driving mechanism 38, and the mold driving mechanism 38 moves the mold holding unit 3 in the up-down direction (along the Z-axis) while a mold chuck 11 holds the mold 8. The mold driving mechanism 38, which includes an actuator and other components, can move the mold 8 also in directions parallel to the X-axis and the Y-axis as well as to the Z-axis and in rotational directions around the X-axis and the Y-axis. The mold driving mechanism 38 moves the mold holding unit 3 downward (in the −Z direction) and thereby brings a pattern region 8a formed on the mold 8 into contact with the imprint material 14 (mold pressing). The irradiation unit 2 emits curing light 9 and thereby cures the imprint material 14 while the pattern region 8a is in contact with the imprint material 14 that is disposed on a shot area 20 of the substrate 10. After the imprint material 14 is solidified, the mold driving mechanism 38 moves the mold holding unit 3 upward (in the +Z direction) and thereby releases the pattern region 8a from the solidified imprint material 14 (mold release).

The mold holding unit 3 may have a space 13 therein, which is partitioned by the mold 8 and a partition plate 41. The pattern region 8a of the mold 8 can be deformed by regulating the pressure inside the space 13 when the mold 8 is pressed or released. For example, if the pressure inside the space 13 is increased during mold pressing, the pattern region 8a of the mold 8 is deformed convexly relative to the substrate 10, and the pattern region 8a and the imprint material 14 can be brought into contact with each other in this state.

The substrate holding unit 4 includes a substrate chuck 16 and a substrate driving mechanism 17. The substrate chuck 16 holds the substrate 10, and the substrate driving mechanism 17 controls the position of the substrate 10 with respect to at least two directions along the X-axis and the Y-axis in the XYZ coordinate system. The position of the substrate holding unit 4 is detected using a mirror 18 disposed on the substrate holding unit 4 and an interferometer 19. Alternatively, an encoder may be used to detect the position of the substrate holding unit 4 instead of using the mirror 18 and the interferometer 19.

The supply unit 5 (dispenser) supplies an uncured imprint material 14 onto the shot area 20 of the substrate 10. The imprint material is a curable composite that cures (solidifies) by receiving energy for curing. The curable composite may be otherwise called an uncured-state resin. The energy for curing may be an electromagnetic wave, heat, or the like. The electromagnetic wave may be infrared radiation, visible radiation, or ultraviolet radiation selected, for example, from wavelengths ranging from 10 nm or more and 1 mm or less.

The curable composite is a composite that solidifies by light irradiation or by heating. A light curable composite that can be solidified by light at least includes a polymerizable compound and a photopolymerization initiator. When necessary, a non-polymerizable compound and a solvent may also be included. The non-polymerizable compound is at least one of agents, such as a sensitizer, a hydrogen donor, a mold release additive, a surfactant, an antioxidant, and a polymer component.

The imprint material is applied onto the substrate as a film by using a spin coater or a slit coater. Alternatively, the imprint material may be applied onto the substrate by using a liquid ejection head as liquid droplets, or islands or films that are formed by connecting multiple liquid droplets. The coefficient of viscosity of the imprint material (at 25° C.) is in a range of, for example, 1 mPa·s or more and 100 mPa·s or less.

The image pickup unit 6 (detection unit) is configured to pick up an image of the entire shot area 20 formed on the substrate 10. The image pickup unit 6 can detect a state in which the area of contact between the pattern region 8a and the imprint material 14 spreads from the center of the shot area 20 toward the periphery thereof.

The mold 8 serves to mold the imprint material 14 on the substrate 10. The mold 8 may be otherwise called a template or an original. The mold 8 is shaped like a rectangle and has the pattern region 8a that has a pattern (a pattern of projections and depressions) to be transferred onto the imprint material supplied on the substrate 10. The mold 8 is made of a material, such as quartz, that can transmit curing light 9 (ultraviolet rays) for curing the imprint material on the substrate 10.

The substrate 10 may be made of glass, ceramics, metal, resin, or a semiconductor. When necessary, a member made of a material different from that of the substrate 10 may be formed on the substrate 10. More specifically, the substrate may be a silicon wafer, a compound semiconductor wafer, quartz glass, or the like.

The mark detector 12 (detection unit) detects light coming from a mark formed on the mold 8 and from a mark formed on the substrate 10 and thereby detects the positional relationship of the marks. The imprint apparatus 1 can obtain the positional relationship between the mold 8 and the substrate 10 on the basis of the detection results of the mark detector 12. The imprint apparatus 1 can align the mold 8 and the substrate 10 with each other by moving at least one of the mold 8 and the substrate 10.

The imprint apparatus 1 according to the present embodiment further includes a selective irradiation unit 50 that irradiates the shot area 20 on the substrate 10 (and the pattern region 8a of the mold 8) with light in a frame-like manner. In addition, the imprint apparatus 1 according to the present embodiment includes a dichroic mirror 36 and a dichroic mirror 37. The dichroic mirror 36 is used to combine light for the irradiation unit 2 and light for the image pickup unit 6, and the dichroic mirror 37 is used to combine light for the selective irradiation unit 50 and light for the image pickup unit 6.

The control unit 7 controls mechanisms included in the imprint apparatus 1 so as to form patterns on a plurality of shot areas 20 formed on the substrate 10. In addition, the control unit 7 is configured to control the mold holding unit 3, the substrate holding unit 4, the supply unit 5, the irradiation unit 2, the selective irradiation unit 50, and the mark detector 12. The control unit 7 may be disposed within the imprint apparatus 1. Alternatively, the control unit 7 may be disposed outside the imprint apparatus 1 and may control the imprint apparatus 1 remotely.

Imprinting Method

Figure 2:
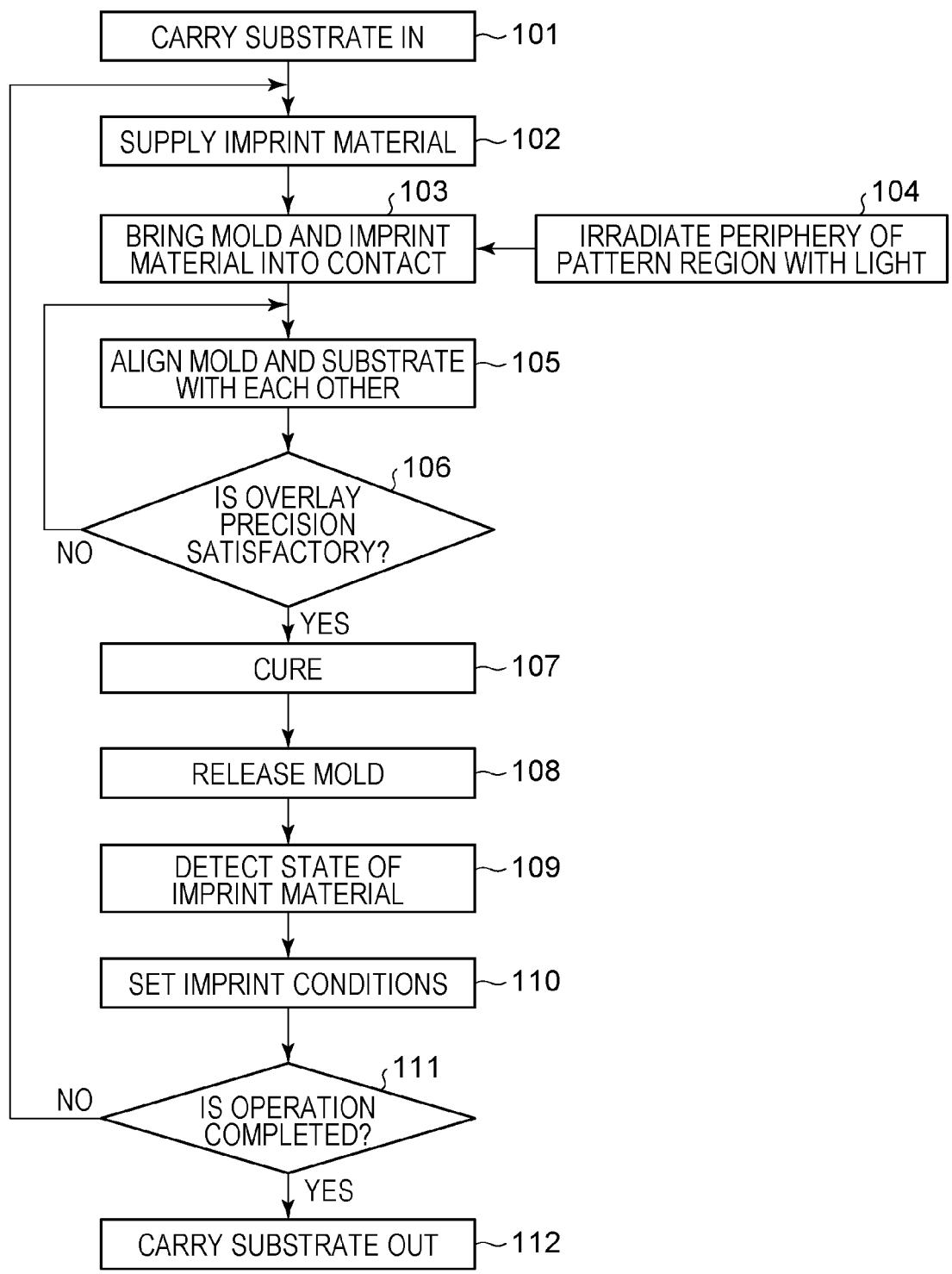
FIG. 2 is a flowchart illustrating an imprinting process.

FIG. 2 is a flowchart illustrating an imprinting process in which the imprint apparatus 1 forms a pattern of the imprint material 14 on the substrate 10 by using the imprint apparatus 1. An imprinting method that employs a light curing method will be described with reference to FIG. 2.

In step 101, when the imprinting process is started, a substrate 10 is first conveyed to the imprint apparatus 1. More specifically, the substrate 10 is carried into the substrate chuck 16 of the substrate holding unit 4 by a substrate conveying mechanism (not illustrated).

In step 102, the supply unit 5 supplies the imprint material 14 onto the shot area 20 formed on the substrate 10. In step 103, the imprint material 14 disposed on the shot area 20 of the substrate 10 and the pattern region 8a of the mold 8 are brought into contact with each other by narrowing the gap between the mold 8 and the substrate 10 (mold pressing step). Here, the mold 8 may be pushed against the substrate 10 for contact, or the substrate 10 may be pushed against the mold 8. Alternatively, the mold 8 and the substrate 10 may be moved simultaneously so as to come into contact with each other.

Figure 3A:
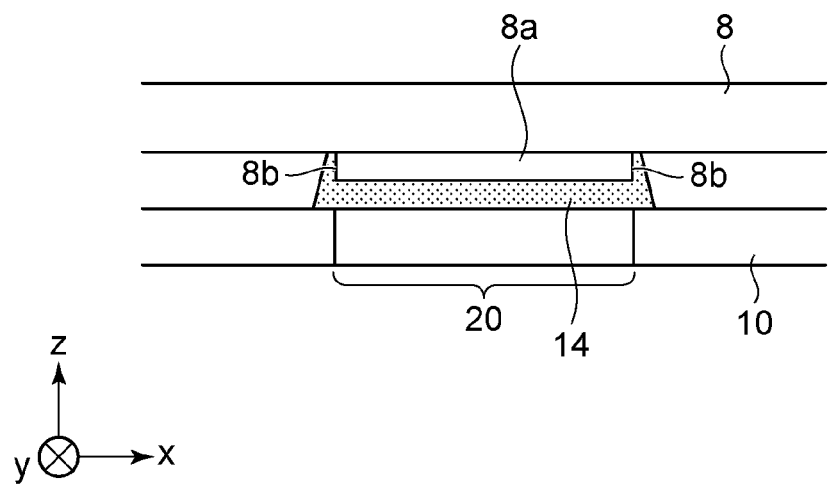
FIGS. 3A and 3B are side views illustrating a pattern region of a mold and an imprint material.
Figure 3B:
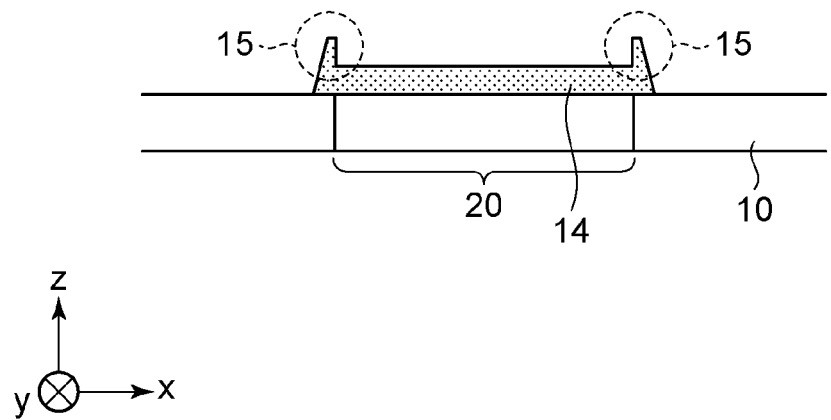

In this mold pressing step, the imprint material 14 may be extruded from the pattern region 8a and the shot area 20. FIGS. 3A and 3B are side views illustrating the imprint material 14 on the pattern region 8a of the mold 8 and on the shot area 20 of the substrate 10. It has been observed in the mold pressing step that as illustrated in FIG. 3A, the imprint material 14 is extruded from the pattern region 8a of the mold 8 and the imprint material 14 adheres to side surfaces 8b of the pattern region 8a. If the imprint material 14 adheres to the side surfaces 8b of the pattern region 8a and solidifies in this state, the imprint material 14 is shaped outside the shot area 20 in an extruded manner as illustrated in FIG. 3B when the mold 8 is released from the imprint material 14 (in a mold releasing step). Note that illustration of a fine pattern of projections and depressions corresponding to the pattern region 8a is omitted in FIGS. 3A and 3B.

If protruding portions 15 of the imprint material 14 are formed as illustrated in FIG. 3B, the film thickness of imprint material 14 formed on the substrate becomes uneven, which may have a negative impact on etching treatment or the like to be performed at a later stage. Moreover, a portion of the imprint material 14 adhering to the side surfaces 8b of the pattern region 8a may flake off and become foreign matter on the substrate 10 during the imprinting process. The foreign matter on the substrate 10 may come into contact with the pattern region 8a of the mold 8 during the mold pressing step. If the foreign matter on the substrate comes into contact with the mold 8, the fine pattern formed on the pattern region 8a of the mold 8 may be damaged by the foreign matter. This may lead to faulty patterning.

Thus, in the step 104, the imprint apparatus 1 according to the present embodiment irradiates an irradiated region along a peripheral region of the pattern region 8a with irradiation light 55 when the pattern region 8a comes into contact with the imprint material 14 in step 103. The extrusion of the imprint material 14 in the mold pressing step can be reduced by irradiating the irradiated region along the peripheral region of the pattern region 8a with the irradiation light 55 in step 104. In step 104, the irradiation light 55 is emitted when part of the pattern region 8a comes into contact with the imprint material 14 before step 103 is completed.

Here, a central region of pattern region 8a of the mold 8 on which the fine pattern is formed is not irradiated with the irradiation light 55. Irradiating the peripheral region with the irradiation light 55 increases the viscosity of the imprint material 14, which can reduce the extrusion of the imprint material 14 out of the pattern region 8a. Irradiating the region including the side surfaces 8b of the pattern region 8a with the irradiation light 55 suppresses adhesion of the imprint material 14 to the side surfaces 8b. Moreover, the viscosity of the imprint material 14 remains unchanged in the central region of the pattern region 8a, which enables the imprint material 14 to fill up the fine pattern as smoothly as before.

In step 104, it is desirable to increase the viscosity of the imprint material 14 but not to a level at which the imprint material 14 solidifies. If the imprint material 14 near the side surfaces 8b is solidified to prevent the imprint material 14 from adhering to the side surfaces 8b of pattern region 8a of the mold 8, it may become difficult to perform alignment of the mold 8 and the substrate 10 with each other. Moreover, in the case of a fine structure, such as a mark, being formed in a region near the side surfaces 8b of the pattern region 8a, the imprint material 14 may solidify before the imprint material 14 is filled into the fine structure, which may become a cause of increasing the number of unfilled spots. A decrease in overlay precision and an increase in the number of unfilled spots may reduce the yield.

In step 105, the mold 8 and the substrate 10 are aligned with each other after the mold pressing step is completed and the imprint material 14 is filled between the pattern region 8a and the shot area 20 of the substrate 10 in step 103. For example, the imprint apparatus 1 performs alignment of the mold 8 and the substrate 10 while the imprint apparatus 1 causes the mark detector 12 to detect light coming from the mark formed on the mold 8 and from the mark formed on the substrate 10 and thereby obtains the positional relationship between the mold 8 and the substrate 10.

In step 106, the overlay precision is determined. If the overlay precision satisfies a predetermined value in step 106, the imprint material 14 is solidified in step 107 by the curing light 9 emitted from the irradiation unit 2 while the mold 8 and the imprint material 14 are in contact with each other (curing step). If the overlay precision does not satisfy the predetermined value in step 106, the alignment of the mold 8 and the substrate 10 is performed repeatedly in step 105. Alternatively, if the overlay precision does not satisfy the predetermined value in step 106, the operation may be forced to proceed to the next step (to step 107).

In step 108, the mold 8 is released from the imprint material 14 (mold releasing step) that has been solidified in step 107. In step 109, after the mold 8 is released from the imprint material 14 on the substrate 10, the image pickup unit 6 (detection unit) detects the state of the imprint material 14 and obtains detection results. Subsequently in step 110, imprint conditions are updated for forming a pattern on the next shot area on the basis of the detection results of the imaged state of the imprint material 14. The state of the imprint material 14 may be detected by using the mark detector 12 instead of using the image pickup unit 6. Step 109 and step 110 will be described in detail later.

In step 111, an end determination is performed to determine whether the imprinting operation is completed for a plurality of shot areas 20 formed on the substrate 10. If it is determined in step 111 that the imprinting operation is not completed, the operation returns to step 102, and the imprinting operation is performed for the next shot area 20. The steps of the imprinting operation are repeated until the imprinting operation is completed for the plurality of shot areas 20. If it is determined in step 111 that the imprinting operation is completed, the substrate 10 is carried out of the imprint apparatus 1 in step 112. The substrate 10 is carried out of the substrate chuck 16 of the substrate holding unit 4 by the substrate conveying mechanism (not illustrated).

Selective Irradiation

Figure 4A:
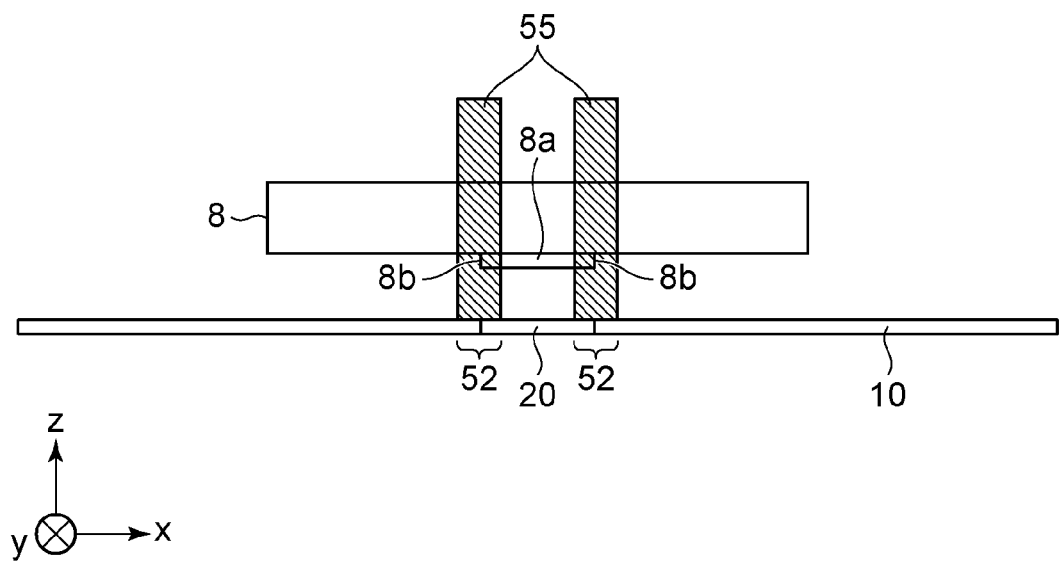
FIGS. 4A and 4B are views illustrating the pattern region of the mold and an irradiated region.
Figure 4B:
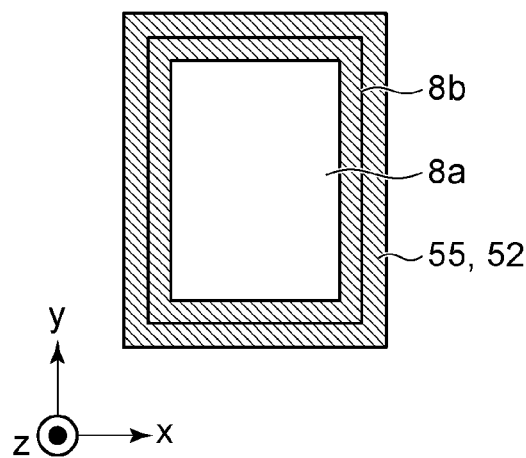

Next, irradiation with the irradiation light 55 performed in step 104 will be described in detail. FIGS. 4A and 4B illustrates the irradiation with the irradiation light 55 performed in step 104.

FIG. 4A is a side view illustrating a relationship of the pattern region 8a of the mold 8, the substrate 10, and the irradiation light 55. As illustrated in FIG. 4A, the irradiation light 55 is emitted in such a manner that the light intensity is distributed in a peripheral region (i.e., an irradiated region 52) of pattern region 8a of the mold 8 that includes the side surfaces 8b. The irradiation light 55 is not limited to ultraviolet rays but may be any type of light that can cause polymerization reaction of the imprint material 14. If the imprint material 14 is solidified by the irradiation light 55, the alignment may be difficult to perform in step 105. Accordingly, in step 104, the irradiation light 55 is emitted so as not to solidify the imprint material 14 but to increase the viscosity of the imprint material 14 near the side surfaces 8b of the pattern region 8a. The wavelength, irradiation duration, and intensity of the irradiation light 55 can be determined appropriately by taking into account, for example, the material property of the imprint material 14.

FIG. 4B, which is viewed in the −Z direction from above, illustrates the relationship between the side surfaces 8b (peripheral region) of the mold 8 and the irradiated region 52 on the shot area 20 of the substrate 10. The irradiated region 52 is irradiated with the irradiation light 55 through the mold 8. As illustrated in FIG. 4B, the irradiated region 52 irradiated with the irradiation light 55 includes the side surfaces 8b of the mold 8. The imprint material 14 can be prevented from extruding out of the pattern region 8a in the mold pressing step by defining the irradiated region 52 of the irradiation light 55 (i.e., by setting the distribution of light intensity) as illustrated in FIGS. 4A and 4B. As illustrated in FIG. 4B, the pattern region 8a is irradiated with the irradiation light 55 in a frame-like manner, which may be called "frame-like irradiation" or "frame-like exposure".

Figure 5A:
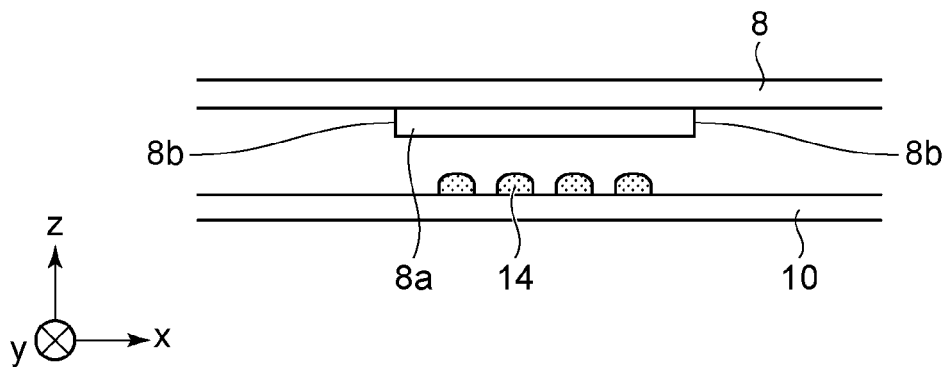
FIGS. 5A, 5B, and 5C are side views illustrating the pattern region of the mold and the imprint material.
Figure 5B:
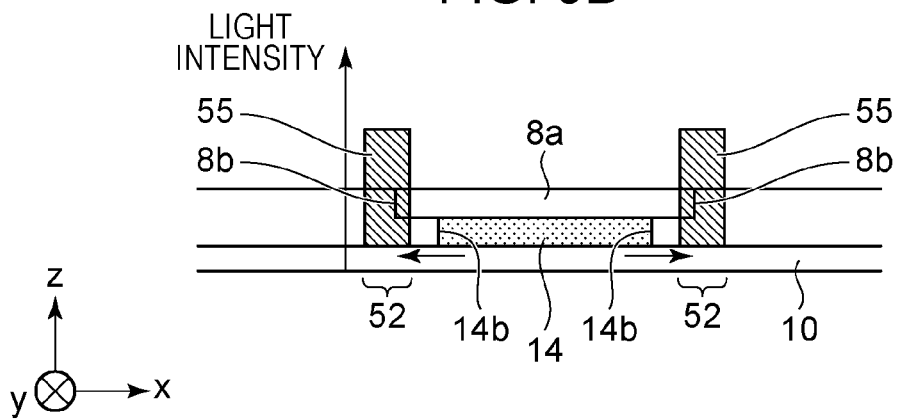
Figure 5C:
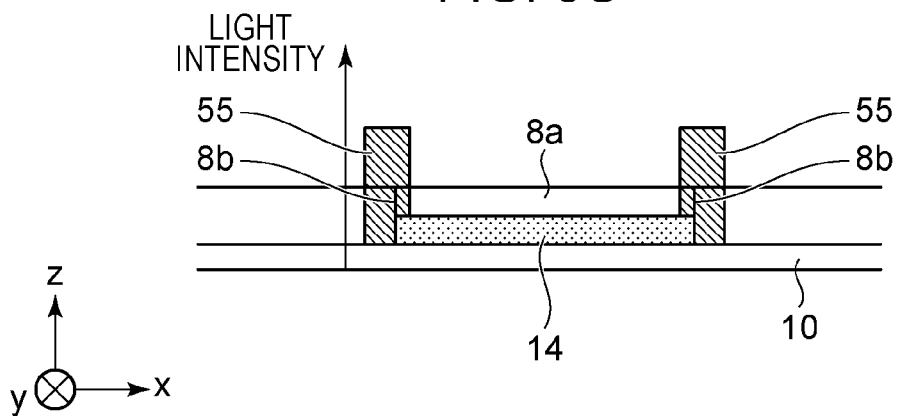

The following describes, with reference to FIGS. 5A to 5C, a state of the imprint material 14 being filled between the mold 8 and the substrate 10 while the mold 8 and the imprint material 14 on the substrate 10 are brought into contact with each other. FIGS. 5A to 5C are side views illustrating the pattern region 8a of the mold 8, the imprint material 14 on the substrate 10, and the irradiation light 55.

FIG. 5A illustrates a state before the pattern region 8a of the mold 8 comes into contact with the imprint material 14. Here, the substrate 10 is not irradiated with the irradiation light 55 yet. When the pattern region 8a of the mold 8 and the imprint material 14 that has been supplied onto the substrate 10 are brought into contact with each other as illustrated in FIG. 5A, the pattern region 8a of the mold 8 may be deformed convexly relative to the substrate 10 and brought into contact with the imprint material 14 in such a manner.

FIG. 5B illustrates a state in which the imprint material 14 is filled between the pattern region 8a of the mold 8 and the substrate 10. As illustrated in FIG. 5B, a contact region between the pattern region 8a of the mold 8 and the imprint material 14 is formed at a central part of the pattern region 8a with which the imprint material 14 comes into contact first. The contact region subsequently starts to spread toward the outside (the peripheral region) of the pattern region 8a. Here, irradiation with the irradiation light 55 is started before the gas-liquid interface 14b of the imprint material 14 moving toward the outside of the pattern region 8a reaches the side surfaces 8b.

In FIG. 5C, the irradiation light 55 initiates polymerization reaction at the gas-liquid interface 14b of the imprint material 14 positioned within the irradiated region 52 irradiated with the irradiation light 55, which increases the viscosity of the gas-liquid interface 14b. Increasing the viscosity of the imprint material 14 in the peripheral region of the pattern region 8a lowers the traveling speed of the gas-liquid interface 14b of the imprint material 14 spreading toward the outside of the pattern region 8a, which can prevent the imprint material 14 from extruding out of the pattern region 8a. Thus, adhesion of the imprint material 14 to the side surfaces 8b of the pattern region 8a can be suppressed.

Selective Irradiation Unit

Figure 6:
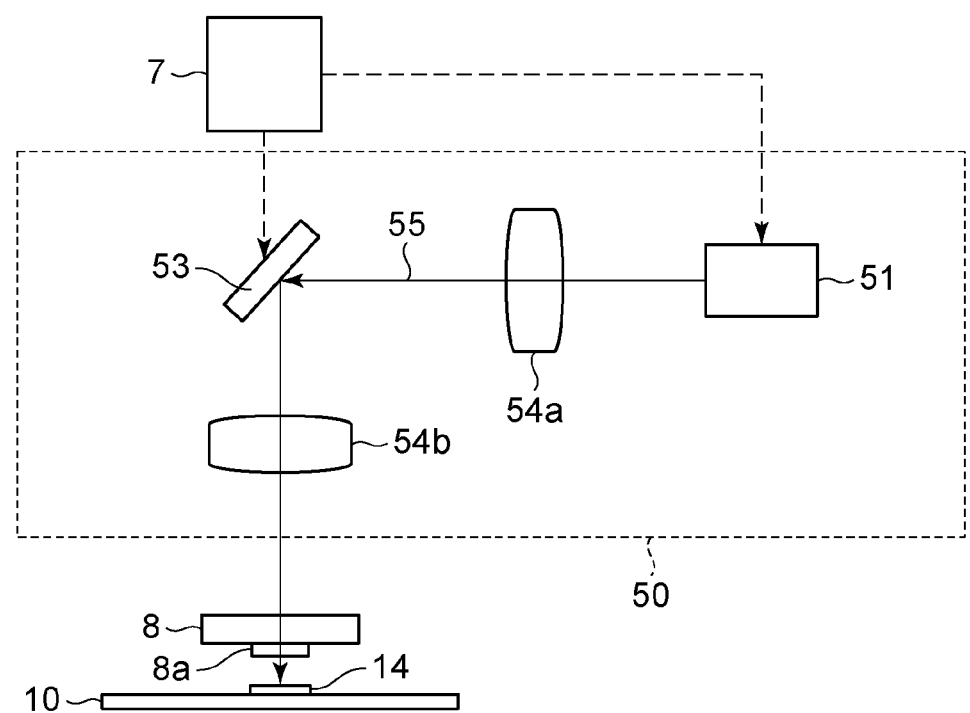
FIG. 6 is a view illustrating an optical system of a selective irradiation unit according to the first embodiment.
Figure 6:
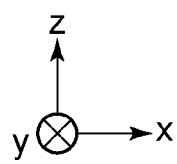

FIG. 6 is a schematic view illustrating an optical system of the selective irradiation unit 50 that emits the irradiation light 55 toward the substrate 10. With reference to FIG. 6, the following describes an example of the optical system with which the selective irradiation unit 50 irradiates the peripheral region of pattern region 8a (the region including the side surfaces 8b) of the mold 8 with the irradiation light 55. The selective irradiation unit 50, which selectively irradiates the shot area of the substrate 10 with the irradiation light 55, includes an irradiation light source 51, a light modulation device 53 (spatial light modulation element), an optical element 54a, and an optical element 54b.

The irradiation light source 51 emits light having a wavelength that causes polymerization reaction of the imprint material 14. The irradiation light source 51 is capable of producing light output sufficient to cause polymerization reaction and obtain a desirable viscosity of the imprint material 14. The irradiation light source 51 is formed, for example, of lamp, laser diode, or LED. Light emitted by the irradiation light source 51 is guided to the light modulation device 53 by the optical element 54a. The light modulation device 53 according to the present embodiment is formed, for example, using a digital micro-mirror device (otherwise referred to as a "DMD"). However, the light modulation device 53 is not limited to the one using the DMD but may be formed using other elements, such as a liquid crystal display (LCD) device and a liquid crystal on silicon (LCOS) device. The selective irradiation unit 50 can define the irradiated region 52 (intensity distribution) and set the intensity of light at any location on the substrate 10 by using the light modulation device 53 disposed between the irradiation light source 51 and the substrate 10. The irradiation light 55, of which the irradiated region 52 (intensity distribution) and the light intensity are regulated by the light modulation device 53, is guided by the optical element 54b and emitted onto the mold 8 and the substrate 10. The irradiation light 55 exiting the light modulation device 53 may be adjusted in magnification for projection on the substrate 10 by the optical element 54b. The irradiation light source 51 and the light modulation device 53 are controlled by the control unit 7.

Next, state detection performed in step 109 and setting of imprint conditions performed in step 110 according to the first embodiment are described below in detail. In the state detection in step 109, the image pickup unit 6 (detection unit) picks up an image of state of the imprint material 14. If the irradiation timing and intensity of the irradiation light 55 emitted onto the irradiated region 52 is appropriate in step 104, extrusion of the imprint material 14 from the pattern region 8a does not occur or unfilled spots of the imprint material 14 are not generated in the pattern region 8a. However, if the irradiation timing and intensity of the irradiation light 55 emitted onto the irradiated region 52 is not appropriate in step 104, the imprint material 14 extrudes from the pattern region 8a or unfilled spots of the imprint material 14 are generated in the pattern region 8a. Accordingly, the state detection in step 109 according to the present embodiment is performed so as to detect the solidified imprint material 14 extruded from the shot area 20 on the substrate 10 and to detect the unfilled spots of the imprint material 14, and detection results are obtained.

If the extrusion of the imprint material 14 from the shot area 20 or the unfilled spot of the imprint material 14 is detected in step 109, the imprint conditions are changed in step 110 for the subsequent imprinting process starting from the next shot area. In the present embodiment, the imprint conditions are meant to be irradiation conditions, such as irradiation timing and intensity of the irradiation light used in the selective irradiation.

If the imprint material 14 extruded from the shot area 20 (or the pattern region 8a) is detected, irradiation with the irradiation light 55 may be late. In this case, the irradiation light 55 is emitted earlier than before for areas at which the extrusion is detected by controlling the light modulation device 53. Instead, the intensity of the irradiation light 55 may not be sufficient. In this case, the intensity of the irradiation light 55 may be increased. It may be appropriate to change both of the irradiation timing and the intensity of the irradiation light 55.

If the unfilled spot of the imprint material 14 is detected in the shot area 20 (or the pattern region 8a), the irradiation light 55 may be emitted early. In this case, the irradiation light 55 is emitted later than before onto the areas at which the unfilled spot is detected by controlling the light modulation device 53. Instead, the irradiation light 55 may be intense. In this case, the intensity of the irradiation light 55 may be decreased. It may be appropriate to change both of the irradiation timing and the intensity of the irradiation light 55.

Figure 7:
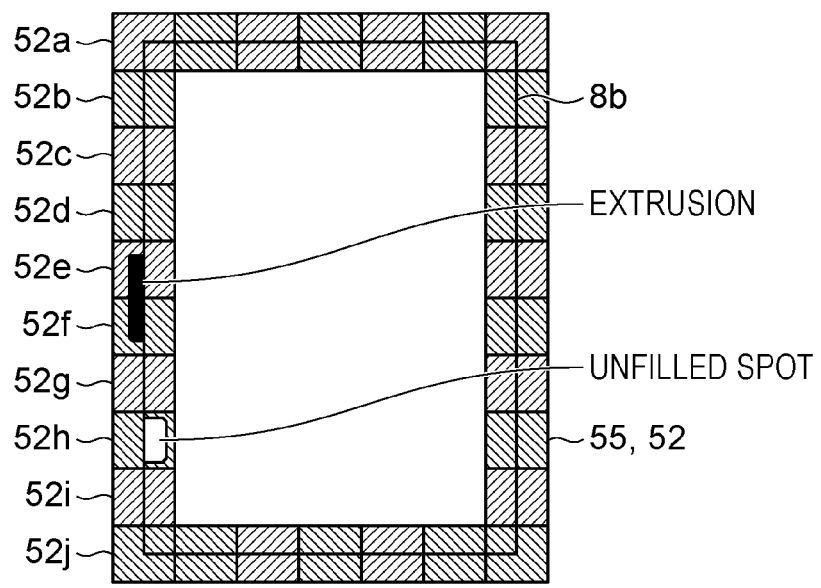
FIG. 7 is a view illustrating detection results from a detection unit according to the first embodiment.

FIG. 7 illustrates an example in which in step 109, extrusion of the imprint material 14 is detected in irradiated subregions 52e and 52f and an unfilled spot is detected in an irradiated subregion 52h.

Figure 8A:
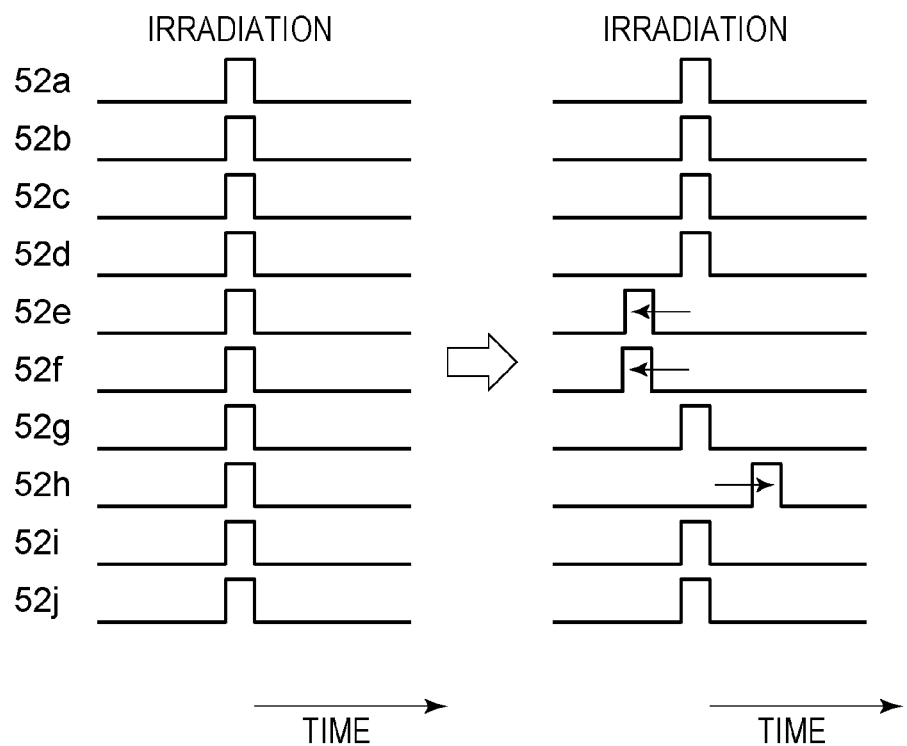
FIGS. 8A and 8B are views illustrating a method of changing irradiation conditions according to the first embodiment.
Figure 8B:
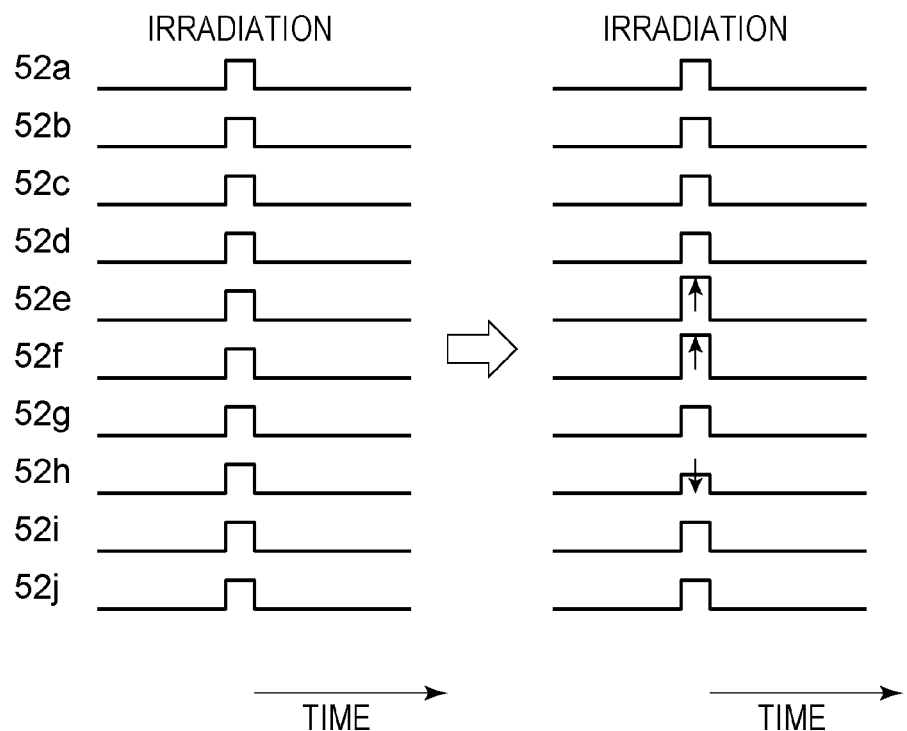

FIGS. 8A and 8B are views illustrating a method of changing the irradiation conditions according to the present embodiment. The following describes a method of changing the irradiation conditions (imprint conditions) in the case in which the detection results illustrated in FIG. 7 are obtained from the state detection performed by the detection unit (the image pickup unit 6) in step 109. FIGS. 8A and 8B are views for describing actuation timing of the light modulation device 53 (digital micro-mirror device) corresponding to irradiated subregions 52a to 52j illustrated in FIG. 7 and also for describing control of intensity of the irradiation light emitted onto the substrate 10.

FIG. 8A illustrates a case of changing the irradiation timing of the irradiation light 55 emitted onto the irradiated subregions 52a to 52j on the substrate 10. The irradiation timing is changed by controlling the light modulation device 53 included in the selective irradiation unit 50 on the basis of the detection results from the detection unit (image pickup unit 6). The left view of FIG. 8A illustrates the irradiation timing before the imprint conditions are changed. The left view of FIG. 8A illustrates a case in which multiple irradiated subregions 52a to 52j are irradiated with the irradiation light 55 simultaneously after a certain elapsed time. As a result of irradiation with the irradiation light 55 in accordance with the irradiation timing illustrated in the left view of FIG. 8A, the detection results of the imprint material are obtained as illustrated in FIG. 7. Accordingly, in step 110, the imprint conditions are changed as illustrated in the right view of FIG. 8A, in other words, the irradiated subregions 52e and 52f are irradiated with the irradiation light 55 earlier than before, whereas the irradiated subregion 52h is irradiated with the irradiation light 55 later than before. These changes are applied to the subsequent pattern forming starting from the next shot area.

FIG. 8B illustrates a case of changing the irradiation intensity (light intensity) of the irradiation light 55 emitted onto the irradiated subregions 52a to 52j on the substrate 10. The irradiation intensity is changed by controlling the light modulation device 53 included in the selective irradiation unit 50 on the basis of the detection results from the detection unit (image pickup unit 6). The left view of FIG. 8B illustrates irradiation intensity (light intensity) before the imprint conditions are changed. The left view of FIG. 8B illustrates a case in which multiple irradiated subregions 52a to 52j are irradiated with the irradiation light 55 simultaneously after a certain elapsed time. As a result of irradiation with the irradiation light 55 in accordance with the irradiation intensity (light intensity) illustrated in the left view of FIG. 8B, the detection results of the imprint material are obtained as illustrated in FIG. 7. Accordingly, in step 110, the imprint conditions are changed as illustrated in the right view of FIG. 8B, in other words, the irradiation intensity of the irradiation light 55 emitted onto the irradiated subregions 52e and 52f is increased, whereas the irradiation intensity of the irradiation light 55 emitted onto the irradiated subregion 52h is decreased. These changes are applied to the subsequent pattern forming starting from the next shot area.

Note that only the left side of the shot area 20 (pattern region 8a) has been described with reference to FIGS. 7, 8A, and 8B, for convenience of description. In reality, however, the imprint conditions are updated for all of the subregions along the periphery of the shot area 20. The irradiated region 52 is described as divided into 10 subregions longitudinally and 7 subregions laterally by way of example. In reality, however, the irradiated region 52 can be divided into more subregions in accordance with the resolution of the light modulation device 53.

The change of the imprint conditions can be applied to all of the subsequent imprinting processes starting from the pattern forming on the next shot area, or alternatively can be applied only to the subsequent imprinting processes for the shot areas included in the same shot layout region on the substrate 10. Alternatively, the change of the imprint conditions can be applied only to an imprinting process for an arbitrary one of the shot areas on the substrate.

As described in the present embodiment, the imprint conditions for the selective irradiation with the irradiation light 55, in other words, the irradiation timing and the irradiation intensity of the irradiation light 55, can be changed on the basis of the detection results of the imprint material obtained by the detection unit. This can reduce the likelihood of extrusion and unfilled spots of imprint material 14 occurring for the shot area 20 of the substrate 10 (or the pattern region 8a of the mold 8).

Second Embodiment

Next, a method of changing the imprint conditions according to a second embodiment will be described. The imprinting method according to the second embodiment will be described by focusing on what are different from those described in the first embodiment and thereby omitting duplicate descriptions. In the imprinting method according to the second embodiment, the imprint conditions set in step 110 relate to a mold pressing method. The mold pressing method is changed on the basis of the detection results from the state detection of the imprint material performed by the image pickup unit 6 (detection unit) in step 109.

Figure 9A:
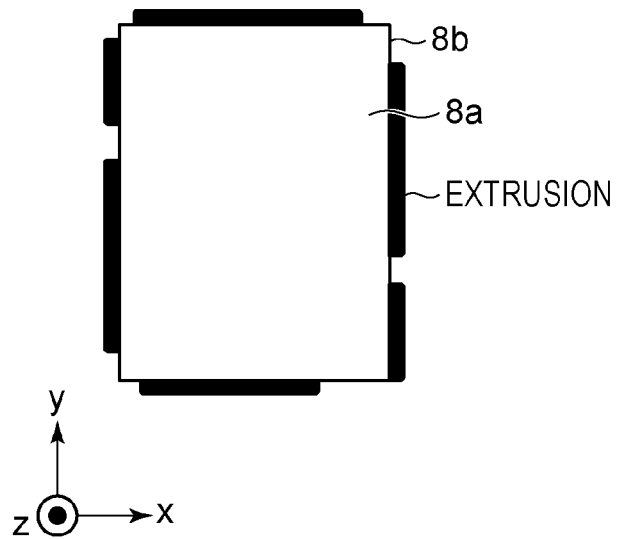
FIGS. 9A, 9B, and 9C are views illustrating detection results from a detection unit according to a second embodiment.
Figure 9B:
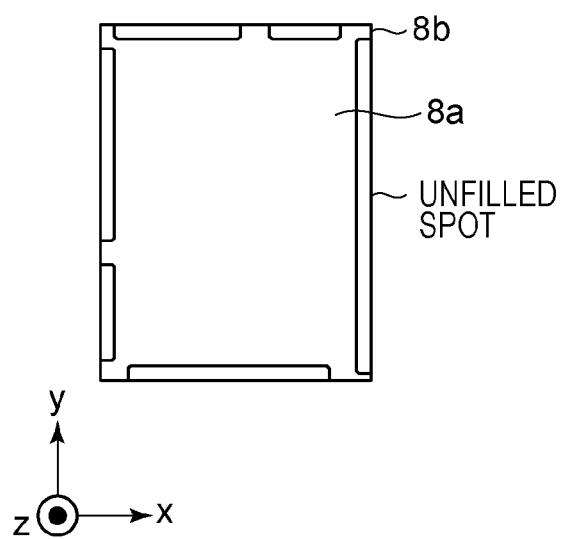
Figure 9C:
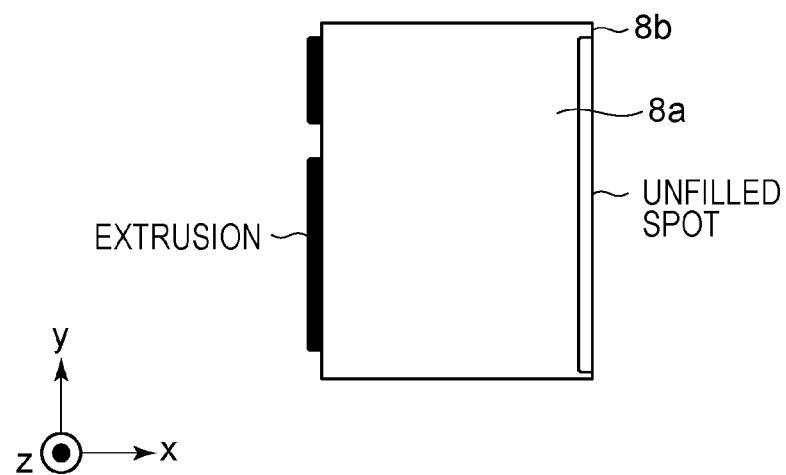

FIGS. 9A to 9C are views illustrating results of the state detection of the imprint material performed by the detection unit in step 109.

FIG. 9A illustrates detection results of extrusion, in other words, a state in which the imprint material 14 is extruded from the side surfaces 8b positioned in the peripheral region of the pattern region 8a. FIG. 9A illustrates a case in which extrusion is detected in many locations along the periphery of the pattern region 8a (shot area 20). If extrusion of the imprint material 14 from the side surfaces 8b is detected in all the sides of the pattern region 8a as is this case, the force for pressing the mold 8 against the imprint material 14 may be large in the mold pressing step. Accordingly, in the case of the detection unit detecting the extrusion of the imprint material 14 as illustrated in FIG. 9A, the pressing force of the mold driving mechanism 38 that brings the mold 8 into contact with the imprint material 14 on the substrate 10 is set to be smaller than before in step 110 for the mold pressing step for the next shot area.

FIG. 9B illustrates a state in which unfilled spots of the imprint material 14 are detected in the pattern region 8a. FIG. 9B illustrates a case in which unfilled spots are detected at many locations along the periphery of the pattern region 8a (shot area 20). If the unfilled spots are detected in the peripheral region along all the sides of the pattern region 8a as is this case, the force for pressing the mold 8 against the imprint material 14 may be small in the mold pressing step. Accordingly, in the case of the detection unit detecting the unfilled spots of the imprint material 14 as illustrated in FIG. 9B, the pressing force of the mold driving mechanism 38 that brings the mold 8 into contact with the imprint material 14 on the substrate 10 is set to be larger than before in step 110 for the mold pressing step for the next shot area.

As described above, in the case of extrusion or unfilled spots being detected along all the sides of the pattern region 8a, the imprint conditions are changed by changing the mold pressing force. However, the imprint conditions may be changed only if extrusion or unfilled spots are detected at a predetermined number of locations in the peripheral region.

FIG. 9C illustrates a state in which both extrusion and unfilled spots of the imprint material 14 are detected in the pattern region 8a. In FIG. 9C, the unfilled spots are detected in the peripheral region along the +X side of the pattern region 8a (shot area 20), and the extrusion of the imprint material is detected in the peripheral region along the −X side thereof. If the extrusion of the imprint material 14 occurs at many locations in the peripheral region along one side of the pattern region 8a and the unfilled spots of the imprint material 14 occur at many locations in the peripheral region along the opposite side thereof, the mold 8 and the substrate 10 may incline relative to each other in the mold pressing step. Accordingly, in the case of the detection unit detecting the extrusion and the unfilled spots of the imprint material 14 as illustrated in FIG. 9C, the inclination of the mold 8 and the substrate 10 are adjusted in step 110, for the mold pressing step of the next shot area, so as to decrease the mold pressing force on the side along which the extrusion occurs.

As described in the present embodiment, the mold pressing force of the mold 8 and the inclination of the mold 8 and the substrate 10 can be changed as the method of changing the imprint conditions in the mold pressing step of the imprinting process on the basis of the detection results of the imprint material obtained by the detection unit. This can reduce the likelihood of extrusion and unfilled spots of imprint material 14 occurring for the shot area 20 of the substrate 10 (or the pattern region 8a of the mold 8). The irradiation timing and the irradiation intensity of the irradiation light 55 as described in the first embodiment may be changed in the mold pressing step in combination with the change of the mold pressing force and the inclination. For example, the occurrence of extrusion and unfilled spots are first reduced roughly by changing the mold pressing force and the inclination as described in the second embodiment, and subsequently, the irradiation timing and the irradiation intensity of the irradiation light 55 may be adjusted precisely as described in the first embodiment.

Third Embodiment

Next, a method of changing the imprint conditions according to a third embodiment will be described. The imprinting method according to the third embodiment will be described by focusing on what are different from those described in the above embodiments and thereby omitting duplicate descriptions. In the imprinting method according to the third embodiment, the imprint conditions relate to locations at which the imprint material is supplied. The locations of the imprint material are changed in step 110 on the basis of the detection results from the state detection of the imprint material performed by the detection unit in step 109. The imprint conditions set in step 110 are applied to the subsequent supply step (step 102) of the imprint material for the next shot area.

FIGS. 10A and 10B are views illustrating states in which liquid droplets of the imprint material 14 are supplied onto shot areas 20 of respective substrates 10 by the supply unit 5 in step 102. In the present embodiment, locations at which the imprint material 14 is supplied on the shot area 20 are determined according to the results obtained from the image of the contact state of the imprint material picked up by the image pickup unit 6 (detection unit) in step 109.

For example, assume that unfilled spots are detected in the peripheral region along the +X side of the pattern region 8a (shot area 20), and extrusion of the imprint material is detected in the peripheral region along the −X side thereof, as illustrated in FIG. 9C. If the imprint material 14 is extruded at many locations in the peripheral region of the pattern region 8a as is this case, the locations of the imprint material 14 supplied may be close to the periphery of the shot area 20. On the other hand, if unfilled spots of the imprint material 14 occur at many locations in the peripheral region of the pattern region 8a, the locations of the imprint material 14 supplied may be distant from the periphery of the shot area 20.

Accordingly, in the case of the detection unit detecting the extrusion and the unfilled spots of the imprint material as illustrated in FIG. 9C, the entire locations at which droplets of the imprint material 14 are supplied for the next shot area are shifted in the +X direction in step 110. In this case, the amount of shift can be determined in accordance with the amount of extrusion or the amount of unfilled spots that have been detected by the detection unit. Adjusting the locations at which droplets of the imprint material are supplied within the shot area can reduce the likelihood of the imprint material extruding from the shot area or the likelihood of the unfilled spots of the imprint material occurring within the shot area.

Alternatively, instead of shifting the entire locations of droplets of the imprint material 14 in the shot area 20 as is the case illustrated in FIG. 10A, only the locations of droplets of the imprint material 14 disposed near the peripheral region of the pattern region 8a may be shifted. Moreover, as illustrate in FIG. 10B, it may be appropriate to individually shift the locations of droplets of the imprint material 14 that correspond to extrusions and unfilled spots detected in step 109. FIG. 10B illustrates an example of shifting the supply locations of the imprint material 14 on the basis of results of the state detection that the extrusion and the unfilled spots of the imprint material 14 are detected by the detection unit as illustrated in FIG. 7.

Other Embodiment

The above-described embodiments are examples in which step 109 and step 110 are performed immediately after an imprinting process for multiple shot areas formed on the substrate is completed. However, step 109 and step 110 may be performed after the imprinting processes for all of the shot areas formed on the substrate are completed. Moreover, the detection unit that performs the state detection of the imprint material may be disposed outside the imprint apparatus 1 and may perform the state detection of the imprint material from the outside of the imprint apparatus 1. In this case, the external detection unit performs the state detection outside the imprint apparatus, and the imprint apparatus 1 obtains detection results from the detection unit. The imprint apparatus 1 may set the imprint conditions for an imprinting process for a substrate that is different from the one for which the state detection has been performed.

The above-described imprint apparatus is the one that cures the imprint material using a light curing method. However, the present embodiments can be applied not only to the imprint apparatus using the light curing method but also to an imprint apparatus that thermally cures the imprint material. In the light curing method, an ultraviolet curing resin may be used. The mold is pressed against the substrate with the resin interposed therebetween, and in this state, the resin is cured by ultraviolet irradiation. The patterned solidified resin is subsequently released from the mold. In the present embodiment, the curing light for irradiation is described as ultraviolet light. However, the wavelength of the curing light can be determined appropriately depending on a type of imprint material to be supplied onto the substrate 1. In the curing method using heat, a thermoplastic resin is heated to a glass-transition temperature or more. The mold is pressed against the substrate with the fluidized resin interposed therebetween. Subsequently, the patterned solidified resin is released from the mold after the resin is cooled.

Manufacturing Method of Article

A patterned solidified object formed by using the imprint apparatus is utilized permanently as at least part of various types of articles or utilized temporarily when various types of articles are manufactured. Here, the article may be, for example, an electric circuit element, an optical element, a micro-electromechanical system (MEMS), a recording element, a sensor, or a mold. An example of the electric circuit element is a volatile or non-volatile semiconductor memory, such as a dynamic random access memory (DRAM), a static random access memory (SRAM), a flash memory, or a magnetic random access memory (MRAM), and a semiconductor element, such as a large-scale integrated circuit (LSI), a charge-coupled device (CCD), an image sensor, or a field programmable gate array (FPGA). An example of a mold is a mold to be used for imprinting.

The patterned solidified object may be used, as it is, as a component of at least part of the above article or may be used temporarily as a resist mask. The resist mask is removed from a substrate in the production process after etching or ion implantation or the like is performed.

Figure 11A:
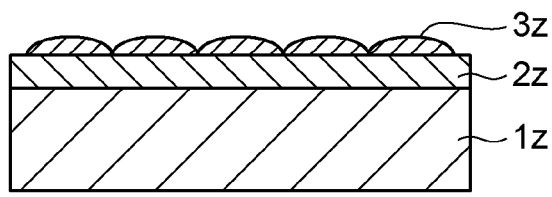
FIGS. 11A, 11B, 11C, 11D, 11E, and 11F are views for describing a manufacturing method of an article.

Next, a manufacturing method of an article will be described specifically. As illustrated in FIG. 11A, a substrate 1z, such as a silicon wafer, having a target material 2z, such as an insulator, formed on the surface thereof is provided. Subsequently, an imprint material 3z is applied onto the surface of the target material 2z by ink jetting or the like. FIG. 11A illustrates a state in which the imprint material 3z is supplied as droplets onto the substrate.

Figure 11B:
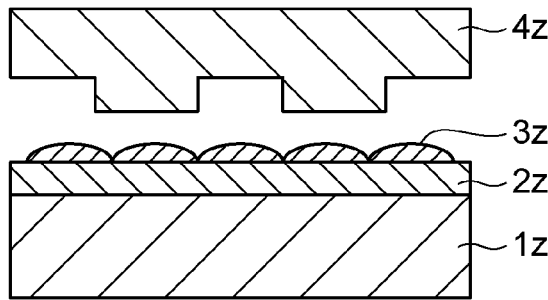
Figure 11C:
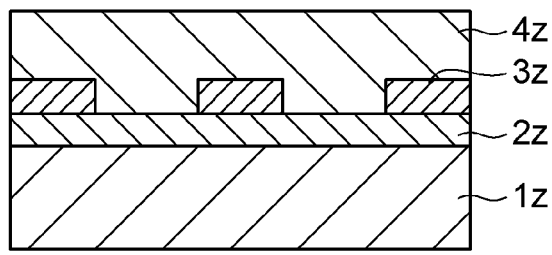

As illustrated in FIG. 11B, a mold 4z for imprinting is disposed so as to oppose the imprint material 3z on the substrate with a surface of the mold 4z having a pattern of projections and depressions facing the imprint material 3z. As illustrated in FIG. 11C, the mold 4z and the substrate 1z having the imprint material 3z are brought into contact with and pressed against each other. The imprint material 3z are filled between the mold 4z and the target material 2z. In this state, the imprint material 3z is irradiated with light as curing energy through the mold 4z, which cures the imprint material 3z.

Figure 11D:
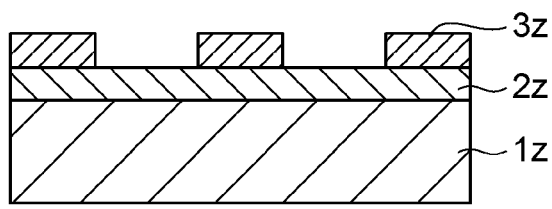

As illustrated in FIG. 11D, the mold 4z and the substrate 1z are released from each other after the imprint material 3z is cured. Thus, the patterned solidified object of the imprint material 3z is formed on the substrate 1z. The patterned solidified object has projections that correspond to the depressions of the mold and depressions that correspond to the projections of the mold. In other words, the pattern of projections and depressions on the mold 4z is transferred onto the imprint material 3z.

Figure 11E:
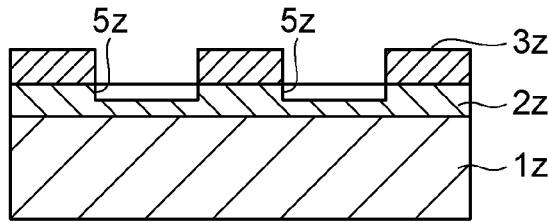
Figure 11F:
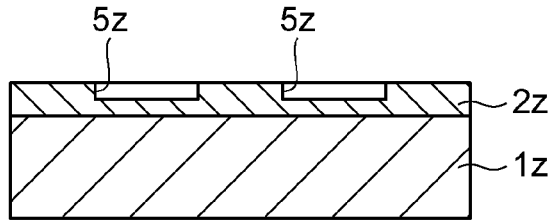

As illustrated in FIG. 11E, the target material 2z is subjected to etching with the patterned solidified object serving as an etching resistant mask. On the surface of the target material 2z, portions of the target material 2z having no solidified object or having only a thin layer of the solidified object remaining thereon are removed to form grooves 5z. As illustrated in FIG. 11F, after the patterned solidified object is removed, an article having grooves 5z formed on the surface of the target material 2z can be obtained. Although the patterned solidified object is removed in this case, the patterned solidified object may be left even after processing and may serve, for example, as an insulating film of interlayer insulation included in a semiconductor element or the like. In other words, the patterned solidified object may be utilized as a constituent member of an article.

Preferred embodiments have been described. However, the present invention is not limited to the embodiments described but may be subjected to various modifications without departing from the spirit of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-068856, filed Mar. 29, 2019, which is hereby incorporated by reference herein in its entirety.

What is claimed is:

1. An imprint apparatus for forming a pattern of an imprint material on a plurality of shot areas of a substrate by using a mold having a pattern region, the imprint apparatus comprising:
   a first irradiation unit that irradiates the substrate with irradiation light capable of solidifying the imprint material; and
   a second irradiation unit configured to irradiate the substrate with selective irradiation light having intensity distribution over a region along a periphery of a shot area of the substrate and capable of increasing viscosity of the imprint material; and
   a control unit that controls light irradiation on the shot area of the substrate by the first irradiation unit and the second irradiation unit,
   wherein the control unit performs control to set an irradiation condition of the second irradiation unit used for irradiating a second shot area of the substrate that is different from a first shot area of the substrate with the selective irradiation light based on a detection result obtained by detecting the first shot area in which a pattern is formed and including at least one of information of an extrusion of the imprint material and an unfilling of the imprint material.

2. The imprint apparatus according to claim 1, further comprising:
   a detection unit that detects the pattern of the imprint material formed on the substrate,
   wherein in a case of the detection unit having detected at least one of the extrusion of the imprint material from the shot area and the unfilling of the imprint material in the shot area, the control unit changes the irradiation condition so as to adjust, following the detection of the detection unit, at least one of the irradiation timing and the irradiation intensity of the selective irradiation light emitted onto the shot area on which the pattern of the imprint material is formed.

3. The imprint apparatus according to claim 2, wherein the detection unit is an image pickup unit configured to pick up an image of the entire shot area formed on the substrate.

4. The imprint apparatus according to claim 2, wherein the detection unit is a mark detector configured to detect light coming from a mark formed at the mold and from a mark formed at the substrate.

5. The imprint apparatus according to claim 1, wherein the control unit is configured to obtain the results of detecting the pattern of the imprint material by using a detection unit provided outside the imprint apparatus and to change the irradiation condition on the basis of the detection results.

6. A method of manufacturing an article, comprising:
   molding a composite on a substrate by using the imprint apparatus according to claim 1; and
   processing the substrate having the composite molded in the molding step.

7. The imprint apparatus according to claim 1, wherein a size of the irradiation region is smaller than a size of the shot area.

8. The imprint apparatus according to claim 1, wherein the plurality of irradiation regions is regions where the selective irradiation light is illuminated, and the shot area is a region where the irradiation light is illuminated.

9. The imprint apparatus according to claim 1, wherein the control unit controls so that irradiation condition by the second irradiation unit used for irradiating the second shot area of the substrate with the selective irradiation light is changed from the irradiation condition in irradiating the first shot area.

10. The imprint apparatus according to claim 1, wherein the irradiation condition of the selective irradiation light is settable for each irradiation region multiply provided in the shot area.

11. The imprint apparatus according to claim 1, wherein the second irradiation unit doesn't irradiate a central part of a shot area with selectively irradiation light.

12. The imprint apparatus according to claim 1, wherein the control unit performs control to change the irradiation condition of the second irradiation unit based on the detection result so that at least one of the extrusion of the imprint material from the shot area and the unfilling of the imprint material in the shot area is to be reduced.

13. A method of adjusting condition for forming a pattern on an imprint material on a plurality of shot areas of a substrate by using a mold having a pattern region, the method comprising:
   irradiating the shot areas of the substrate with selective irradiation light, wherein the selective irradiation light has an intensity distribution over a region along a periphery of the shot area of the substrate and is capable of increasing viscosity of the imprint material;
   irradiating the substrate with irradiation light capable of solidifying the imprint material;
   obtaining a detection result by detecting a first shot area in which a pattern is formed by irradiating with selective irradiation light and by irradiating with irradiation light, and including at least one of information of an extrusion of the imprint material and an unfilling of the imprint material; and
   setting the irradiation condition to be used for irradiating a second shot area different from the first shot area with the selective irradiation light on the basis of the obtained detection results.

14. The method according to claim 13, wherein a size of the irradiation region is smaller than a size of the shot area.

15. The method according to claim 13, wherein the plurality of irradiation is region where the selective irradiation light illuminated, and the shot area is a region where the irradiation light illuminated.

16. An imprinting method for forming a pattern of an imprint material on a shot area of a substrate by using a mold having a pattern region, the imprinting method comprising:
   Irradiating the substrate with the selective irradiation light under the imprint condition set according to claim 13; and
   irradiating the substrate with irradiation light that solidifies the imprint material.

* * * * *